(12) United States Patent
Margaritis

(10) Patent No.: US 11,848,539 B2
(45) Date of Patent: Dec. 19, 2023

(54) NARROW LINEWIDTH SEMICONDUCTOR LASER DEVICE

(71) Applicant: Georgios Margaritis, Los Altos, CA (US)

(72) Inventor: Georgios Margaritis, Los Altos, CA (US)

(73) Assignee: IOPTIS CORP., Los Altos, CA (US)

( * ) Notice: Subject to any disclaimer, the term of this patent is extended or adjusted under 35 U.S.C. 154(b) by 0 days.

(21) Appl. No.: 17/665,566

(22) Filed: Feb. 6, 2022

(65) Prior Publication Data
US 2022/0263290 A1    Aug. 18, 2022

Related U.S. Application Data

(60) Provisional application No. 63/151,045, filed on Feb. 18, 2021.

(51) Int. Cl.
| | | |
|---|---|---|
| *H01S 3/30* | (2006.01) | |
| *H01S 5/14* | (2006.01) | |
| *H01S 5/125* | (2006.01) | |
| *H01S 5/02251* | (2021.01) | |
| *H01S 5/024* | (2006.01) | |
| *H01S 5/06* | (2006.01) | |
| *H01S 5/12* | (2021.01) | |

(52) U.S. Cl.
CPC .............. *H01S 5/146* (2013.01); *H01S 5/141* (2013.01); *H01S 5/147* (2013.01); *H01S 5/02251* (2021.01); *H01S 5/02415* (2013.01); *H01S 5/0612* (2013.01); *H01S 5/12* (2013.01); *H01S 5/125* (2013.01); *H01S 5/14* (2013.01)

(58) Field of Classification Search
CPC .......... H01S 5/146; H01S 5/141; H01S 5/147; H01S 5/02251; H01S 5/02415; H01S 5/0612; H01S 5/12; H01S 5/125; H01S 5/14
See application file for complete search history.

(56) References Cited

U.S. PATENT DOCUMENTS

| | | | |
|---|---|---|---|
| 2002/0075914 A1* | 6/2002 | Koyanagi | H01S 5/146 372/20 |
| 2003/0016722 A1* | 1/2003 | Zimmerman | H01S 5/146 372/103 |

(Continued)

*Primary Examiner* — Kinam Park

(57) ABSTRACT

A novel narrow linewidth laser device is disclosed that includes a gain element, such as a quantum well, quantum dot or bulk waveguide laser chip and a fiber Bragg grating formed in an optical fiber positioned to receive the output from a first end of the gain element and return a portion of said output back into the gain element. The fiber Bragg grating is constructed so that its power reflectivity profile has a ratio of reflectivity slope over reflectivity at the 3 dB point below the reflectivity peak on the red side (longer wavelength side) of the grating larger than a value of 2/nm. The operating wavelength of the device may be tuned thermally, electrically, or thermo-electrically to be on the red side of the fiber Bragg grating reflectivity profile, preferably, but not necessarily, at the 3 dB point below the reflectivity peak or lower. In another embodiment, a second grating is optically coupled to a second end of the gain element and has a reflectivity profile that overlaps at least a portion of the reflectivity profile of the front end fiber Bragg grating.

26 Claims, 7 Drawing Sheets

(56) References Cited

U.S. PATENT DOCUMENTS

| | | | | |
|---|---|---|---|---|
| 2003/0039025 A1* | 2/2003 | Mugino | ............... | H01S 5/12 |
| | | | | 359/334 |
| 2004/0213317 A1* | 10/2004 | Hashimoto | ............ | H01S 5/146 |
| | | | | 372/102 |
| 2008/0298402 A1* | 12/2008 | Rossi | ............... | H01S 5/02325 |
| | | | | 372/20 |
| 2010/0303121 A1* | 12/2010 | Alalusi | ............ | H01S 5/141 |
| | | | | 372/92 |
| 2014/0071455 A1* | 3/2014 | Dimashkie | ......... | H01S 5/02438 |
| | | | | 385/11 |
| 2016/0119063 A1* | 4/2016 | Guo | ............. | H04J 14/02 |
| | | | | 398/79 |
| 2017/0093127 A1* | 3/2017 | Kondo | ............ | H01S 5/141 |
| 2017/0331246 A1* | 11/2017 | Zayer | ............ | H01S 5/141 |

\* cited by examiner

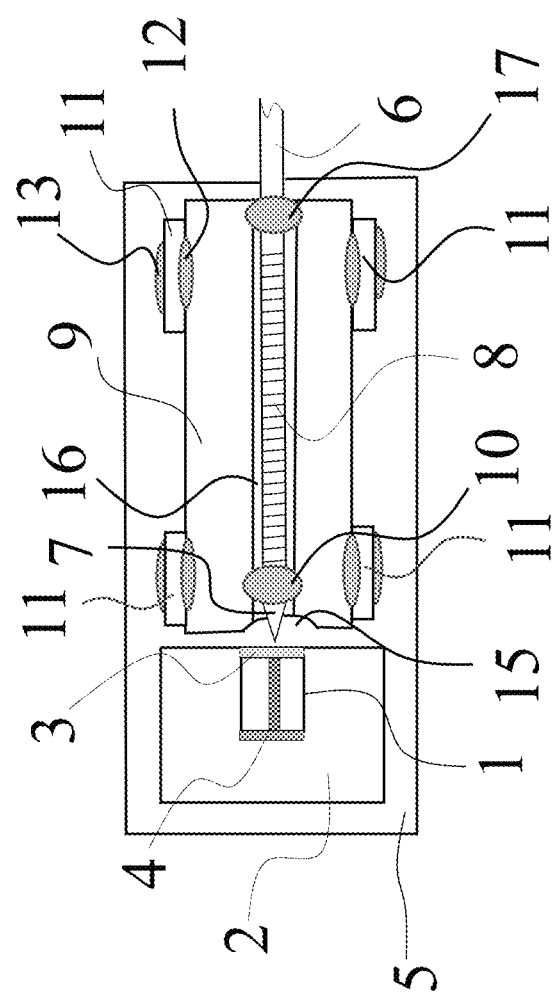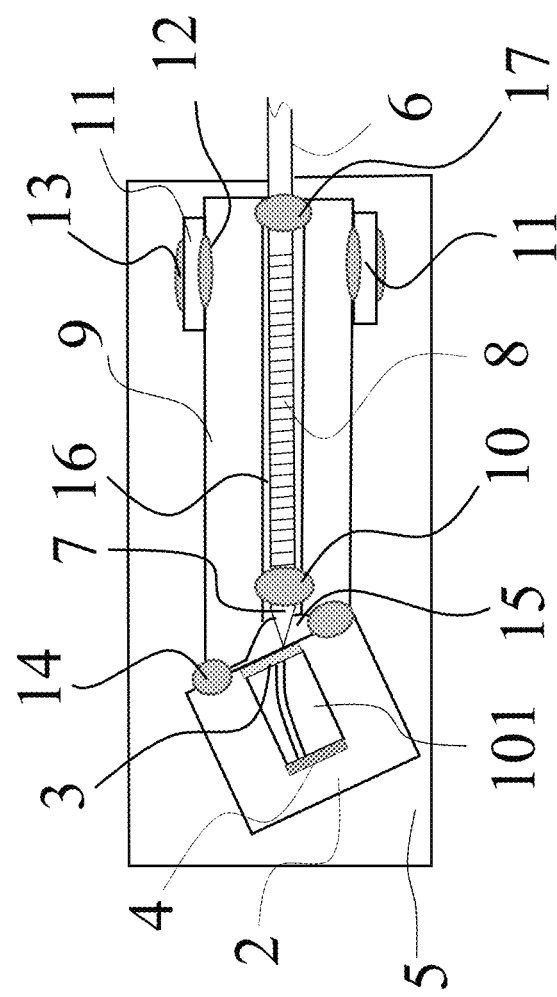

NARROW LINEWIDTH SEMICONDUCTOR LASER DEVICE

This application claims the benefit of U.S. Provisional Application No. 63/151,045, filed on Feb. 18, 2021.

FIELD OF THE INVENTION

The present invention relates to narrow linewidth semiconductor laser devices.

BACKGROUND

Narrow linewidth is a very desirable property of laser devices used in many different applications, such as coherent telecommunications, interferometric sensing, LIDAR's etc. Narrow linewidth is essential to achieving lower dispersion and higher signal to noise ratios in these application.

There are several prior art ways of achieving narrow linewidth. For example, fiber lasers use a hybrid architecture that achieves narrow linewidth by having a very long laser cavity. However, a very long cavity suffers from thermal and acoustic noise, and has a large form factor. More compact Planar Lightwave Circuit (PLCs) based lasers achieve narrow linewidth by using a hybrid architecture where a semiconductor laser chip is combined with an external grating integrated into a silica or other insulating planar waveguide to form an external cavity laser. However, these prior art devices have either large form factors, causing them to suffer from acoustic and thermal noise or the grating integrated in a PLC cannot be easily made with appropriate performance characteristics and are difficult to manufacture.

It is therefore desirable to develop a compact narrow linewidth semiconductor device that achieves better performance than Prior Art semiconductor devices, while having excellent environmental stability and is easier to manufacture.

SUMMARY OF THE INVENTION

The present invention relates to compact narrow linewidth semiconductor devices. The device disclosed in the present invention generates single mode ultra-narrow linewidth laser light, has excellent environmental stability, and small form factor.

According to one embodiment of the present invention, the device includes a gain element, such as quantum well, quantum dot or bulk waveguide laser chip with anti-reflection coating (ARC) on a first end of the gain element and high-reflectivity coating (HRC) on a second end of the gain element. The gain element is attached to a submount, and the submount is attached to a substrate. A fiber carrier is attached to the submount and to the substrate. A fiber Bragg grating is formed in an optical fiber which is positioned to receive the output of the gain element and return a portion of said output back into the gain element. The optical fiber is further attached to the fiber carrier. The fiber Bragg grating is constructed so that its power reflectivity profile has a very high ratio of reflectivity slope over reflectivity at the 3 dB point below the reflectivity peak on the red side (longer wavelength side) of the grating and also has a high side lobe suppression ratio (SLSR) on the red side of the grating. The substrate can be positioned on top of one or more thermoelectric coolers (TECs) to control the temperature profile of the device. The operating wavelength of the device may be tuned thermally, electrically, or thermo-electrically to be on the red side of the grating reflectivity profile, preferably at the 3 dB point below the reflectivity peak or lower. Although there is no upper limit to the length of the grating, other than that imposed by manufacturing technologies, a grating length of less than 20 mm can achieve very narrow linewidth while maintaining small form factor, and low sensitivity to acoustic and thermal noise.

In general, according to the teachings of the present invention, any combination of a gain element with a discrete or distributed back reflector and a fiber Bragg grating properly positioned with respect to said gain element, and having a very high ratio of absolute value of reflectivity slope over reflectivity at the 3 dB point below the reflectivity peak on the red side of the grating can be assembled to provide the desired performance.

LIST OF FIGURES

FIG. 1b shows a perspective view of the exemplary embodiment of the narrow linewidth semiconductor device of the present invention shown schematically in FIG. 1a.

FIG. 3 shows a schematic top view of a second exemplary embodiment of the narrow linewidth semiconductor device of the present invention where a fiber carrier is not directly attached to a chip carrier.

FIG. 4 shows a schematic top view of a third exemplary embodiment of the narrow linewidth semiconductor device of the present invention having a gain element with an angled waveguide.

DESCRIPTION OF THE INVENTION

It is noted that in the following description and the accompanying illustrations, for better clarity, elements that are known in the Art are ignored, if they are not necessary for the understanding of the invention, or are only referred by name without a detailed description. Also, numbering of some obvious repetitive elements in the Figures is omitted.

Figure 1A:
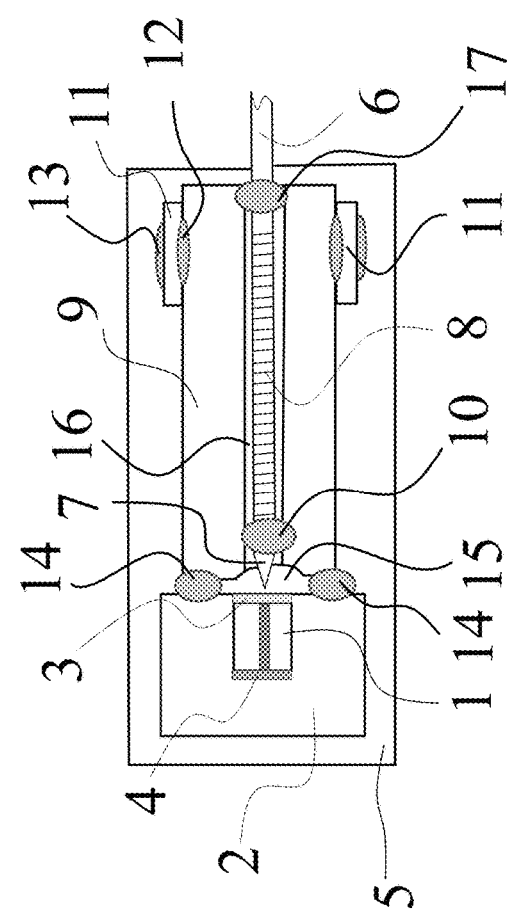
FIG. 1a shows a schematic top view of one exemplary embodiment of the narrow linewidth semiconductor device of the present invention.
Figure 1B:
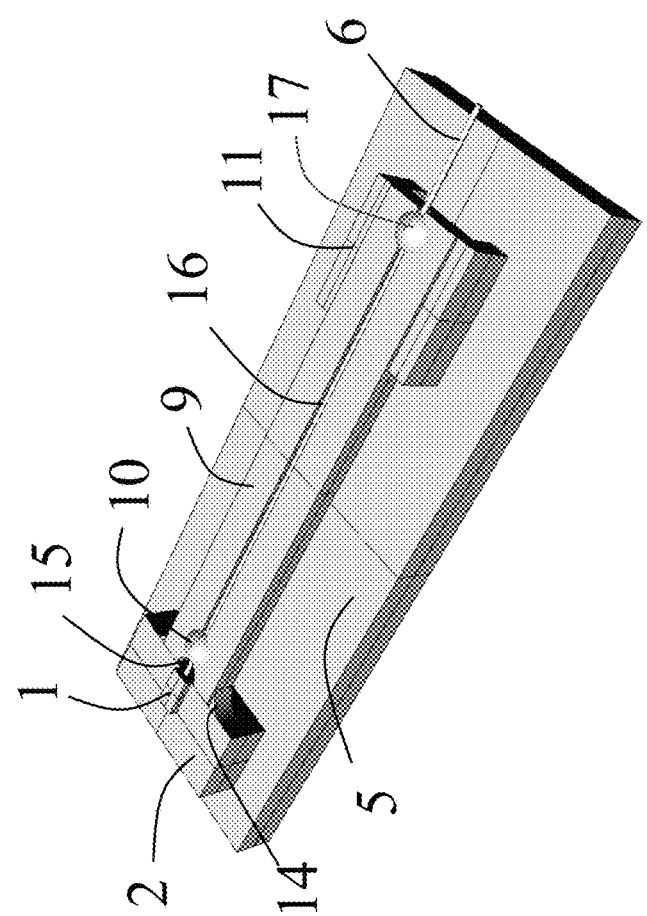

FIG. 1a and FIG. 1b show a top view and a perspective view, respectively, of a first embodiment of the present invention. A gain element 1, such as a quantum well, quantum dot, bulk waveguide etc. laser chip, forms an external cavity laser (ECL) with a fiber Bragg grating (FBG) 8 formed in an optical fiber 6, which for example could be an SMF-28 or PANDA PM single mode optical fiber (but in general any type of fiber in which a grating can be formed can be used). The gain element 1 includes anti-reflection coating (ARC) on a first (front) end 3 of the gain element and high-reflectivity coating (HRC) on a second (back) end 4 of the gain element. The gain element 1 is attached to a submount 2 with, for example, solder or electrically or/and thermally conductive epoxy. Many different types of submounts are known in the Art, such as, for example, those made of aluminum nitride, silicon carbide, alumina etc. The submount 2 is attached to a substrate 5 with, for example, solder or thermally or/and electrically conductive epoxy. Many different types of substrates are known in the Art, such as, for example, those made of aluminum nitride, alumina, silicon, silicon carbide etc. Fiber 6 is attached to a fiber carrier 9 with, for example, two drops of epoxy 10 and 17. A groove 16 on the surface of the fiber carrier 9 could be used to guide the fiber 6. An epoxy, silicone or other material (in general a flowable material) can be used to fill the groove 16 to provide stronger attachment of fiber 6 to fiber carrier 9. Fiber carrier 9 could be made of aluminum nitride, silicon carbide, silicon, alumina or any other rigid material. Fiber carrier 9 is attached to submount 2 at, at least, two locations 14, with, for example two drops of UV epoxy. Fiber carrier 9 is also attached to the substrate 5 with two blocks 11, made, for example, of aluminum nitride. The attachments could be accomplished with drops of epoxy 12 and 13. The fiber Bragg grating 8 is positioned to receive the output of the gain element 1 and return a portion of said output back into the gain element. Fiber 6 includes a lens 7 at its end facing the gain element 1. A notch 15 can also be cut into fiber carrier 9 to prevent the drops of epoxy 10, and 14 from potentially contaminating the lens 7 and the gain element 1.

Figure 2:
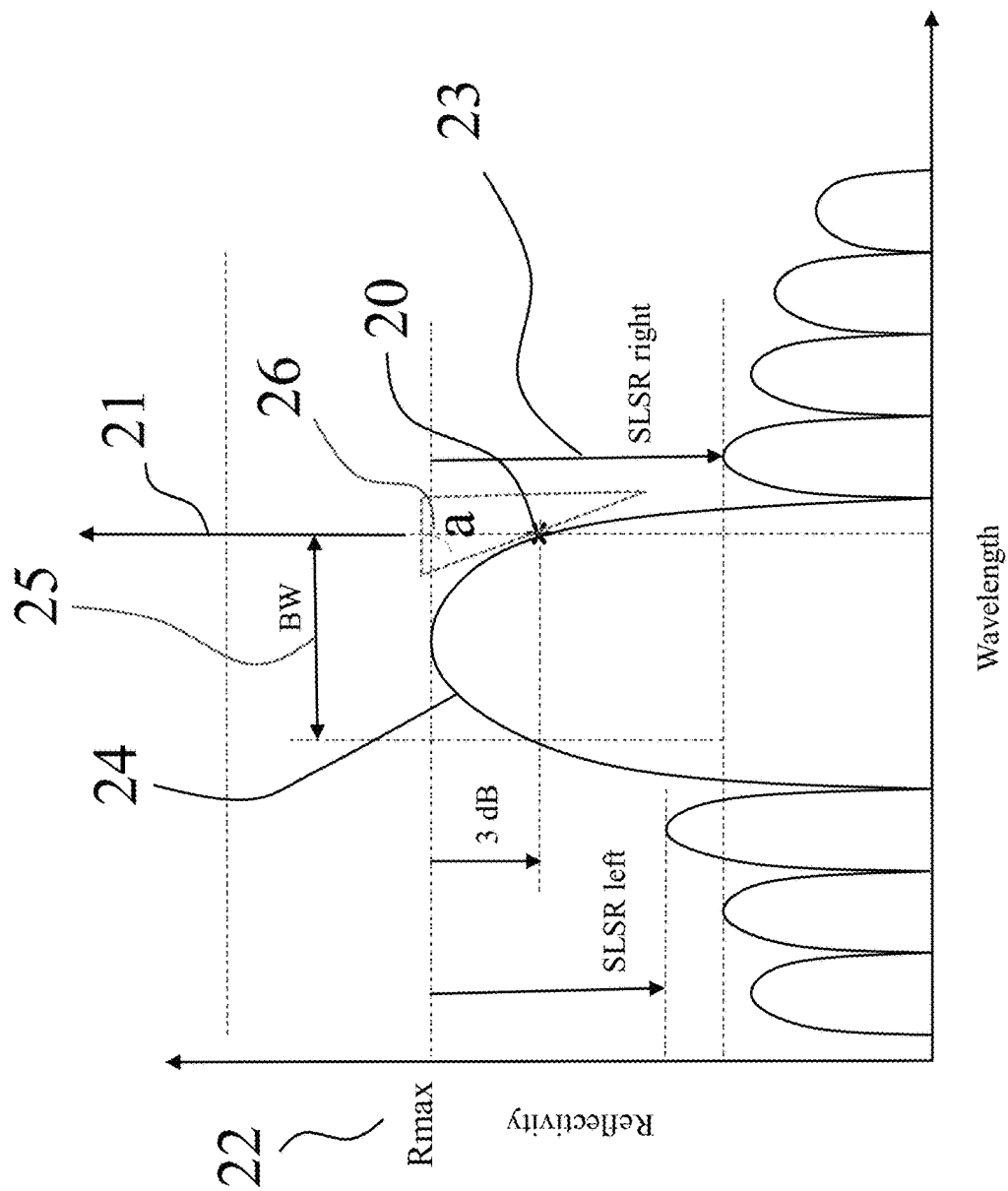
FIG. 2 shows an exemplary grating power reflectivity profile and corresponding lasing modes at operation of the present invention.

FIG. 2 shows a generic power reflectivity profile 24 of the fiber Bragg grating 8 of FIG. 1b of this invention. The grating is constructed such that the absolute value of the tangent of angle a, 26 in FIG. 2, at the 3 dB point, 20 in FIG. 2, below the reflectivity peak on the red (longer wavelength) side of the grating (i.e. the absolute value of the slope of its power reflectivity profile at the −3 dB red point), and its maximum reflectivity, henceforth called Rmax, 22 in FIG. 2, have a ratio, henceforth called S/R ratio, greater than 5/nm, i.e. abs(tan(a))/Rmax>5/nm. The S/R ratio for an FBG of this invention should preferably be 5/nm or higher but S/R ratios as low as 2/nm can produce narrow linewidths, e.g. <50 KHz. In general the higher the S/R ratio the lower the linewidth. In embodiments of the preset invention an S/R ratio of greater than 5/nm can produce Lorentzian linewidths less than 25 kHz, an S/R ratio of greater than 15/nm can produce Lorentzian linewidths less than 15 kHz, an S/R ratio greater than 30/nm can produce Lorentzian linewidth less than 5 kHz, and an S/R ratio greater than 60/nm can produce Lorentzian linewidth less than 2 kHz etc. As examples, to achieve an S/R ratio of, for example, about 20/nm, one could use a grating with slope of 10/nm and max reflectivity of 0.5, or a grating with slope of 20/nm and max reflectivity of about 1, or a grating with slope of 5/nm and max reflectivity of about 0.25 etc. The grating profile 24 also has a side lobe suppression ratio (henceforth called SLSRr) on the red side of the grating, 23 in FIG. 2 greater than 4 dB to produce single mode and hence prevent multi-mode lasing. But higher SLSRr e.g. 5 dB, 10 dB or larger can allow for higher power devices. The FBG can be uniform or apodized, as needed, to meet the SLSRr requirements. Numerous apodizations are possible, for example Gaussian, Cauchy, Bartlett etc. Fiber 6 is preferably cleaved and lensed in such a way that the end of grating 8 facing the gain element 1 is positioned within a few micrometers from the end face 3 of gain element 1. However, placing the end of grating 8 facing the gain element 1 further away is also possible. The −3 dB bandwidth (BW) of the grating can vary over a wide range but in most cases it will be <1 nm, with smaller bandwidths (e.g. <300 pm) improving device operation. An exemplary FBG of this invention could be uniform with physical length of 10 mm, refractive index contrast of 1E-4, that produces reflectivity >70%, SLSR>5 dB, BW<200 pm and S/R ratio>10/nm. However, reflectivities down to 5% or less and wider bandwidths can also produce high S/R ratios and therefore narrow linewidth devices. It is noted however that gratings with higher maximum reflectivities (e.g. >50%) can produce devices with lower thresholds and higher optical power to bias current ratios than lower reflectivity gratings and therefore improve thermal performance and electrical power efficiency. To achieve desired S/R ratios and SMSRrs as taught here, the refractive index contrast of the FBG, its physical length and apodization should be varied, preferably first in a design tool, such as FIMMPROP from Photon Design or GratingMOD from Synopsys, to find appropriate values, before it is manufactured. It is noted that many FBGs with physical lengths greater than about 3 mm, in glass fibers, could be manufactured to achieve high S/R ratios and high SLSRrs. Any FBG length (from 3 mm to several cm) is possible. Although FBGs with long physical lengths (>20 mm) could be used, FBGs with shorter lengths, e.g. <20 mm, can both achieve very narrow linewidth, and reduce acoustic and thermal noise and form factor by adjusting refractive index contrast and apodization to achieve desired S/R ratios, SMSRrs and bandwidths.

Figure 9:
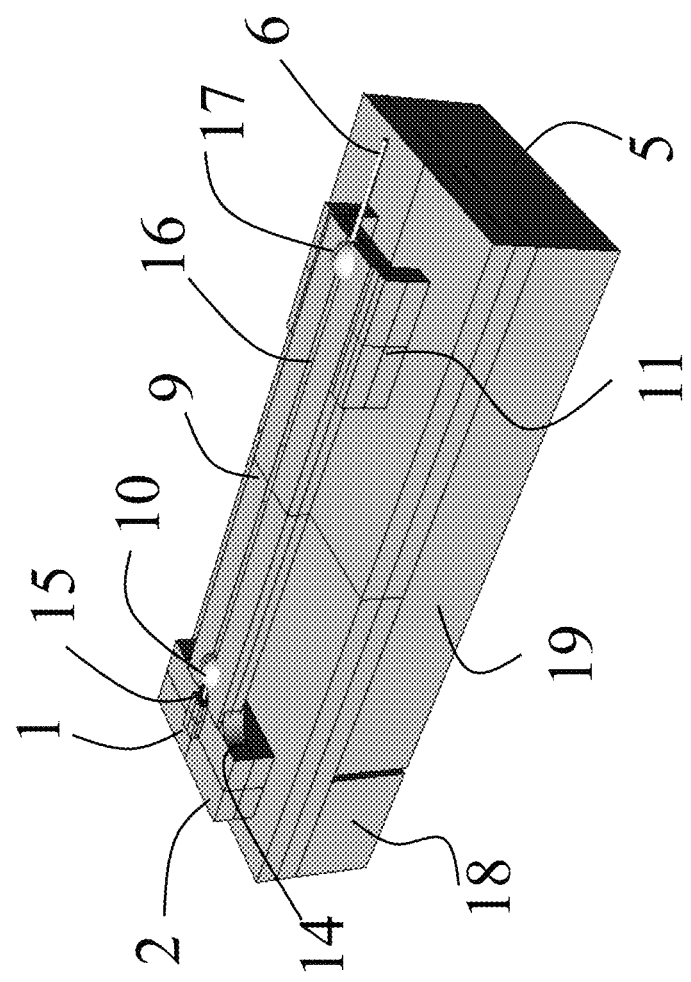
FIG. 9 shows a schematic top view of a seventh exemplary embodiment of the narrow linewidth semiconductor device of the present invention wherein two thermoelectric coolers are used to control independently the temperature of a gain element and an FBG.

The substrate 5 can be positioned on top of one or more thermoelectric coolers (TECs) to control the temperature profile of the substrate and the device. For example, as shown in FIG. 9 by using two TECs 18 and 19, the temperature of the gain element 1 and the FBG 6 can be controlled independently. The operating wavelength of the device, 21 in FIG. 2, may be tuned thermally, electrically, or thermo-electrically to be on the red side of the grating reflectivity profile, preferably at the 3 dB point below the reflectivity peak, 20 in FIG. 2, or lower. In general, changing the temperature of the gain chip or/and FBG to the same or different values, or changing the bias current or currents through the gain element, the lasing wavelength of the device will change along the grating profile 24 in FIG. 2. The optimal operating point is at the 3 dB point, 20 in FIG. 2, below the reflectivity peak, or lower. However, operation at other operating points (e.g. at −1 dB, −2 dB, or even at peak of grating) is possible, but with some broadening of the linewidth.

Numerous other variations of the embodiment described above and shown schematically in FIG. 1a are possible. The gain element could be any semiconductor chip known in the art of any wavelength, for example 980 nm, 1064 nm, 1320 nm or 1550 nm, 1650 nm etc. The front end 3 could be AR coated, angled or both. The second end 4 of gain element 1 could be as cleaved or even coated with a low reflectivity coating, instead of HR coated. In another embodiment second end 4 of gain element 1 could be AR coated, and an external mirror or lenses and mirrors could be appropriately positioned outside gain element 1 to reflect all or portion of the light exiting gain element 1 back into gain element 1. The gain element 1 could also include a phase section, a grating and/or a beam expander. The ECL output could be collected from fiber 6 or from back end 4 (coated, for example, with a low reflectivity coating) of the gain element 1. Fiber 6 could extend outside the package that encloses the ECL (such as a 14-pin butterfly package, a TOSA etc.) or could be cut into a straight or angled fiber stub that can be AR coated and be completely inside the enclosing package. The fiber can be hermetically sealed through the package opening (e.g. spout). Lenses and isolators beyond end of fiber 6 can be used to carry the light out of the device and provide protection from back reflections, as is well known in the Art. Fiber 6 could be a single mode (SM) or Polarization maintaining (PM) fiber or any other optical fiber known in the Art. Fiber 6 could also be a high numerical aperture fiber (having high germanium doping for example). Lens 7 could be formed on the fiber end, or could be a separate lens or lenses between the fiber end and the gain element 1. Also Lens 7 could be anti-reflection (AR) coated. With a high numerical aperture fiber, a flat fiber end face, instead of the lens 7, can achieve good coupling efficiency between gain element 1 and fiber 6, and therefore a lens could be omitted. Fiber 6 could be metallized and also could be attached to fiber carrier 9 with solder. Metallization of the fiber will also assist in hermetic sealing of the fiber through a packaging feedthrough. Groove 16 may be absent. Fiber 6 could be attached directly to top surface of fiber carrier 9. Groove 15 may be absent, if for example solder is used for attachments 10 and 14, or/and grooves may be made on submount 2 instead of on fiber carrier 9. Attach points 14 could be made of solder. Blocks 11 could be attached with solder or be absent and have fiber carrier 9 directly attached to substrate 5 with, for example, epoxy or other adhesive material or solder. Submount 2, substrate 5 and fiber carrier 9 could have metal traces and electrical connections (be printed circuit boards) to carry electrical signals to power the gain element 1 and other known to the art devices, such as thermistors, photodiodes, thermoelectric coolers, phase sections, heaters etc. that may be placed on submount 2, fiber carrier 9 or substrate 5. One or more of epoxies 10, 11, 13, 14 and 17 could be UV curable or thermal or a combination, or could be replaced with other adhesives or metal or glass solders. Numerous enclosing packages can be used to house the present invention, such as butterfly packages, TOSAs, hermetic or non-hermetic metal, plastic or ceramic enclosures etc.

FIG. 3 shows another embodiment of the present invention where the fiber carrier 9 is attached only to substrate 5, with blocks 11, and is not attached directly to submount 2.

FIG. 4 shows another embodiment of the present invention where gain element 101 is angled, submount 2 is attached at an angle with respect to fiber 6, and fiber carrier 9 is cut at an angle to match the gain element light exit angle.

Figure 5:
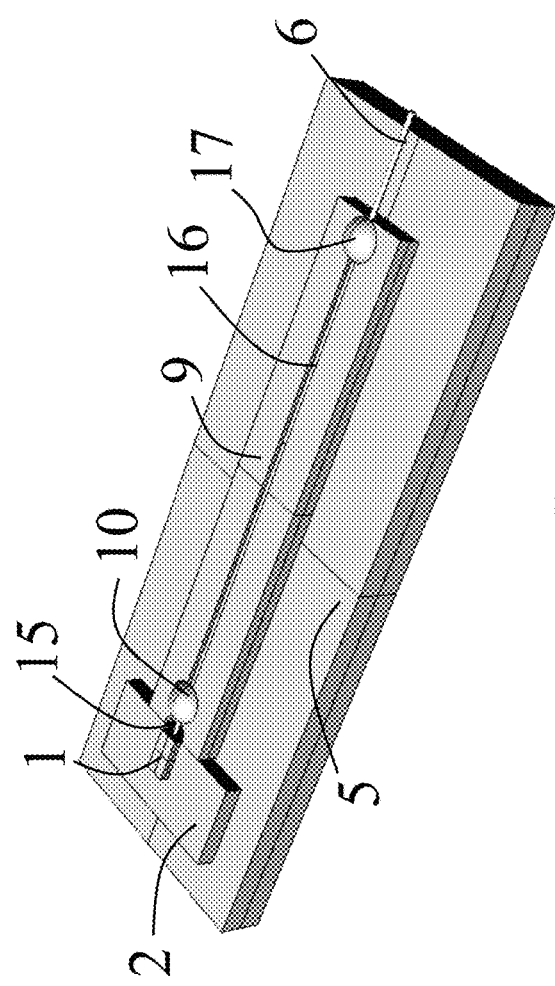
FIG. 5 shows a perspective view of a fourth exemplary embodiment of the narrow linewidth semiconductor device of the present invention wherein a gain element and a fiber grating are directly attached to the same substrate.

FIG. 5 shows another embodiment of the present invention where the fiber carrier 9 is attached directly to substrate 5 without using blocks or other intermediary components. The attachment could be accomplished, for example, with epoxy or other adhesive material, solder etc.

Figure 6:
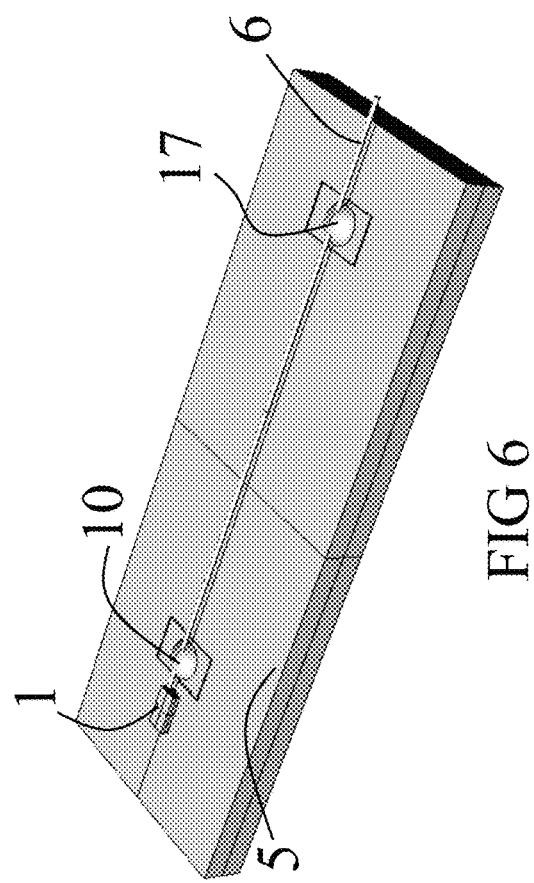
FIG. 6 shows a perspective view of a fifth exemplary embodiment of the narrow linewidth semiconductor device of the present invention wherein a fiber carrier is directly attached to a substrate.

FIG. 6 shows another embodiment of the present invention where gain element 1 and fiber 6 are attached directly to substrate 5 without using any intermediary submounts or fiber carriers. The attachment could be accomplished, for example, with epoxy or other adhesive material, solder, silicone, brazing, laser welding etc. as appropriate.

Figure 7:
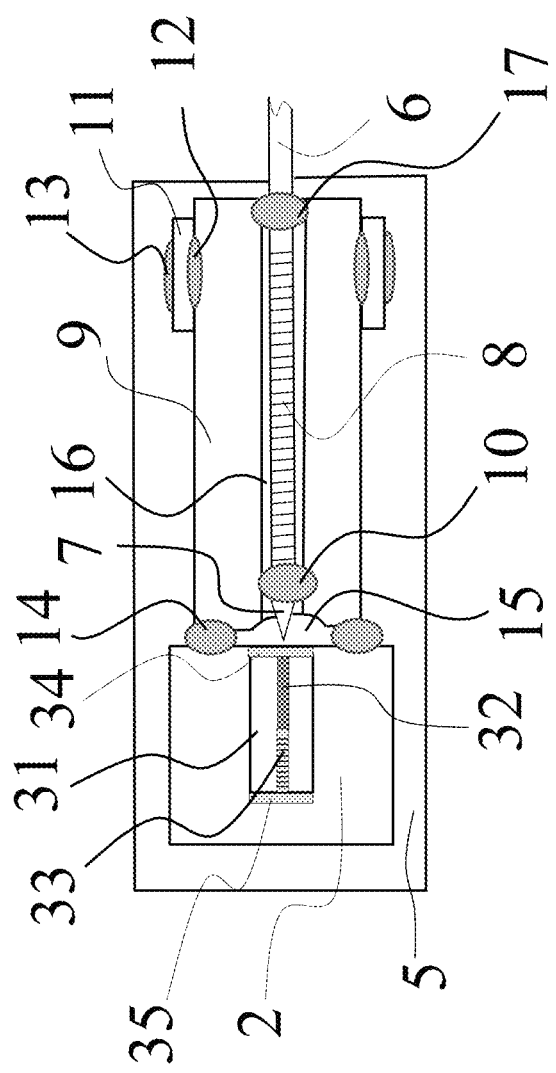
FIG. 7 shows a schematic top view of a sixth exemplary embodiment of the narrow linewidth semiconductor device of the present invention wherein the gain element includes a grating that provides selective back reflection.
Figure 8:
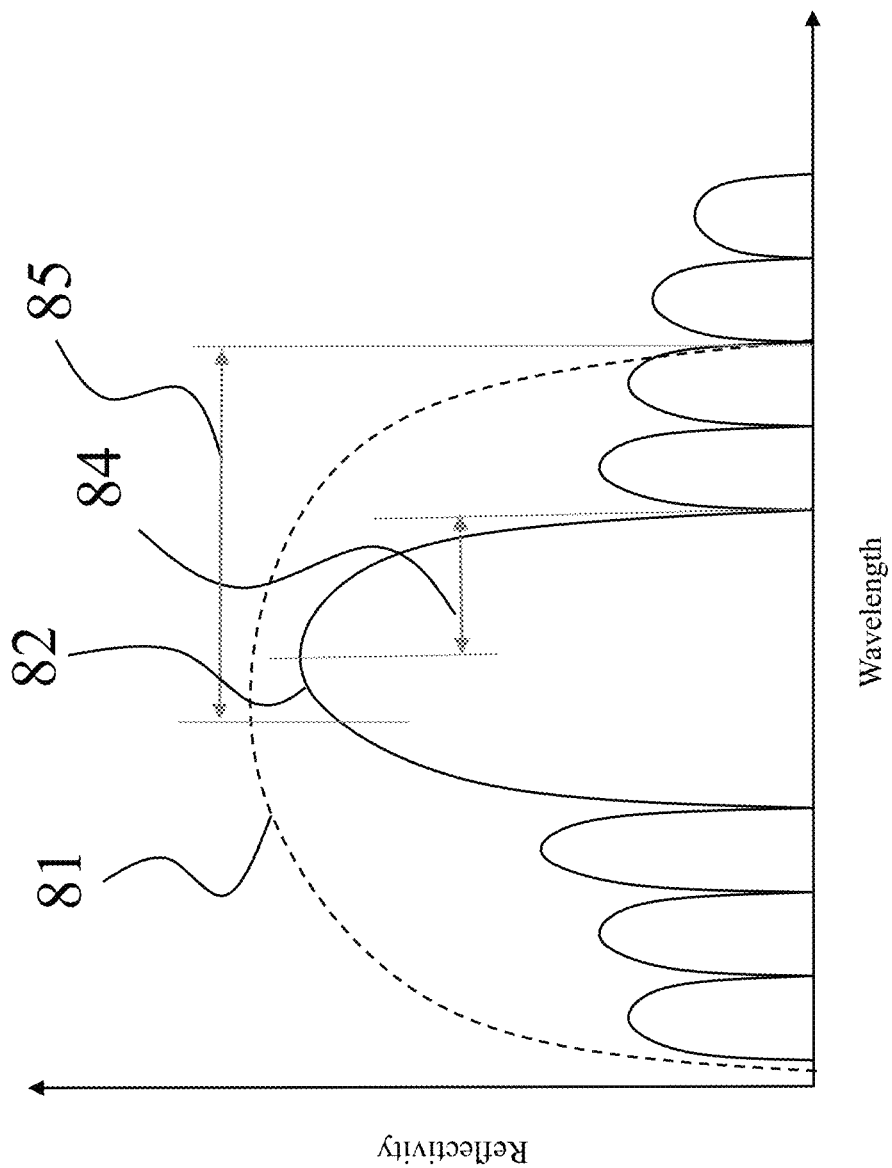
FIG. 8 shows an exemplary power reflectivity profile of a distributed back reflector which is part of a gain element and a power reflectivity profile of a fiber Bragg grating, of the present invention.

FIG. 7 shows another embodiment of the present invention including a gain element 31 that includes a gain section 32 a grating 33 and a low reflectivity (e.g. AR coated) facet 35 to prevent unwanted reflections back into the cavity. The grating 33 has a power reflectivity profile with main lobe shown as 81 of FIG. 8. The red portion 85 of the main lobe 81 overlaps with the red portion 84 of the main lobe 82 of fiber Bragg grating 8 of FIG. 7. In general, main lobes 81 and 82 should each one have at least a portion that overlaps with a portion of the other. Gain element 31, may also have a phase section to adjust the operating point of the device or to introduce frequency modulation, and/or it may have a curved or angled waveguide and/or a beam expander to minimize back reflections and achieve better coupling with the Fiber Bragg grating. Also, grating 33 could be formed on a separate material than gain element 31 (e.g. an optical fiber) and then optically coupled to the back end of optical element 31. In that case the back end of gain element 33 and both ends of grating 33 should be anti-reflection (AR) coated or lensed to minimize reflections. In general, any wavelength selective reflective element could be optically coupled, monolithically or discretely, to the back end of said gain element, provided that said optical coupling has low reflectivity (e.g. <1%), and said wavelength selective reflective element allows non reflected light to pass through and out of said reflective element without significant back reflections (e.g. <1%). This embodiment greatly reduces unwanted modes and therefore enhances the optical signal to noise ratio of the device.

All embodiments above should be construed broadly, since numerous variations of the embodiments can be made by a person skilled in the Art, by substituting any element or elements of a shown embodiment with another element or elements of another embodiment or with an element or elements known in the Art that perform or accomplish the same or similar function.

What is claimed is:

1. A semiconductor laser device comprising a gain element that can generate laser light, having a front end and a back end, an optical fiber positioned in front of the front end to accept, at least, a portion of said laser light and return, at least, a portion of said laser light back into said gain element, and a fiber Bragg grating formed in a portion of said optical fiber, said fiber Bragg grating having a power reflectivity profile with a ratio of an absolute value of a slope at a minus three dB point on a red side to a maximum reflectivity value greater than 2/nm, and wherein the device can produce single mode laser light with a Lorentzian linewidth smaller than 50 kHz.

2. The semiconductor laser device of claim 1 wherein said gain element is attached to a submount, said submount is attached to a substrate, said optical fiber is attached to a fiber carrier, and said fiber carrier is attached to said submount.

3. The semiconductor laser device of claim 2 wherein said fiber carrier includes a notch facing the front end of said gain element.

4. The semiconductor laser device of claim 2 wherein said fiber carrier is further attached to said substrate with at least one block.

5. The semiconductor laser device of claim 2 wherein said attachments are done with materials selected from the group consisting of epoxies and solders.

6. The semiconductor laser device of claim 1 wherein said gain element has an angled waveguide with respect to its front facet.

7. The semiconductor laser device of claim 2 wherein said fiber carrier has an angled facet facing the gain element.

8. The semiconductor laser device of claim 2 wherein said fiber is encapsulated in a flowable material.

9. The semiconductor laser device of claim 1 wherein said gain element is attached to a substrate, and said optical fiber is attached to said substrate.

10. The semiconductor laser device of claim 9 wherein said optical fiber is encapsulated in a flowable material.

11. The semiconductor laser device of claim 1 wherein said ratio further exceeds a value of 5/nm and said slope at the minus three dB point on the red side of said fiber Bragg grating exceeds a value of 5/nm.

12. The semiconductor laser device of claim 1 wherein said fiber Bragg grating has a length of 3 mm or longer.

13. The semiconductor laser device of claim 1 wherein said slope, said maximum reflectivity and said ratio are preselected so that the device can produce single mode laser light with a Lorentzian linewidth value smaller than a value selected from the group consisting of 25 kHz, 15 kHz, 5 kHz and 2 kHz.

14. A semiconductor laser device comprising a gain element that can produce laser light, having a front end and a back end, an optical fiber positioned in front of the front end to accept, at least, a portion of said light and return, at least, a portion of said light back into said gain element, and a front end fiber Bragg grating formed in a portion of said optical fiber and a back end wavelength selective reflective element optically coupled to the back end of said gain element and wherein at least a portion of a power reflectivity profile of said back end wavelength selective reflective element overlaps with at least a portion of a reflectivity profile of said front end fiber Bragg grating and wherein a ratio of an absolute value of a power reflectivity slope at a minus three dB point on a red side of said front end fiber Bragg grating to a maximum value of a power reflectivity of said front end fiber Bragg grating exceeds a value of 2/nm, and wherein the device can produce single mode laser light with a Lorentzian linewidth smaller than 50 kHz.

15. The semiconductor laser device of claim 14 wherein said back end wavelength selective reflective element is a grating formed in a waveguide.

16. The semiconductor laser device of claim 15 wherein said waveguide is monolithically connected to said gain element.

17. The semiconductor laser device of claim 14 wherein said gain element is attached to a submount, said submount is attached to a substrate, said optical fiber is attached to a fiber carrier, and said fiber carrier is attached to said submount and to said substrate.

18. The semiconductor laser device of claim 17 wherein said fiber carrier includes a notch facing the front end of said gain element.

19. The semiconductor laser device of claim 17 wherein said fiber carrier is attached to said substrate with at least one block.

20. The semiconductor laser device of claim 17 wherein said attachments are done with materials selected from the group consisting of epoxies and solders.

21. The semiconductor laser device of claim 14 wherein said gain element has an angled waveguide with respect to its front facet.

22. The semiconductor laser device of claim 17 wherein said fiber carrier has an angled facet facing the gain element.

23. The semiconductor laser device of claim 14 wherein said gain element is attached to a substrate, and said optical fiber is attached to said substrate.

24. The semiconductor laser device of claim 23 wherein said optical fiber is encapsulated in a flowable material.

25. The semiconductor laser device of claim 14 wherein said ratio further exceeds a value of 5/nm and said slope at the minus three dB point on the red side exceeds a value of 5/nm.

26. The semiconductor laser device of claim 14 wherein said front end fiber Bragg grating has a length of 3 mm or longer.

* * * * *